(12) United States Patent
Sugiyama

(10) Patent No.: US 12,354,933 B2
(45) Date of Patent: Jul. 8, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Toru Sugiyama, Musashino Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 459 days.

(21) Appl. No.: 17/942,562

(22) Filed: Sep. 12, 2022

(65) Prior Publication Data

US 2023/0307504 A1 Sep. 28, 2023

(30) Foreign Application Priority Data

Mar. 22, 2022 (JP) .................. 2022-045606

(51) Int. Cl.
*H01L 23/495* (2006.01)
*H01L 23/00* (2006.01)
(Continued)

(52) U.S. Cl.
CPC ........ *H01L 23/49575* (2013.01); *H01L 24/73* (2013.01); *H01L 25/16* (2013.01);
(Continued)

(58) Field of Classification Search
CPC ... H10D 89/10; H01L 23/49575; H01L 25/16; H01L 25/18
See application file for complete search history.

(56) References Cited

U.S. PATENT DOCUMENTS 9,762,230 B2 9/2017 Seeman et al.
2013/0187627 A1* 7/2013 Imada ............... H01L 23/49575
323/311

(Continued)

FOREIGN PATENT DOCUMENTS

JP H02-278915 A 11/1990
JP H07-161986 A 6/1995

(Continued)

OTHER PUBLICATIONS

Notice of Reasons for Refusal (Office Action) dated Feb. 18, 2025 in corresponding Japanese Patent Application No. 2022-045606, 10 pages (with English machine translation).

*Primary Examiner* — Joseph C. Nicely
(74) *Attorney, Agent, or Firm* — Kim & Stewart LLP

(57) ABSTRACT

A semiconductor device includes a substrate, a first transistor of a depletion type, a second transistor of an enhancement type, and a gate control circuit. The first and second transistors are provided on the substrate and each include a channel region of a first conductivity type. The first and second transistors are connected in series. The channel region of the first transistor includes a nitride semiconductor. The second transistor operates via an inversion layer of a second conductivity type induced in the channel region thereof. The gate control circuit is connected to a gate electrode of the second transistor. The substrate includes a gate terminal and a power supply terminal. The gate terminal is electrically connected to a gate electrode of the first transistor. The power supply terminal is electrically connected to a connection part between the first transistor and the second transistor.

14 Claims, 5 Drawing Sheets

(51) Int. Cl.
    *H01L 25/16*     (2023.01)
    *H01L 25/18*     (2023.01)
    *H01L 21/56*     (2006.01)
    *H01L 23/31*     (2006.01)

(52) U.S. Cl.
    CPC .............. *H01L 25/18* (2013.01); *H01L 21/56* (2013.01); *H01L 23/3142* (2013.01); *H01L 2224/73265* (2013.01)

(56) References Cited

U.S. PATENT DOCUMENTS

2016/0065064 A1    3/2016  Zojer
2018/0006639 A1*  1/2018  Sander .................... H01L 24/49
2022/0102251 A1*  3/2022  Kinzer .................... H01L 24/73

FOREIGN PATENT DOCUMENTS

JP         2013153027 A    8/2013
JP         2016-540477 A   12/2016
JP           6470284 B2    2/2019

* cited by examiner

SEMICONDUCTOR DEVICE

CROSS-REFERENCE TO RELATED APPLICATIONS

This application is based upon and claims the benefit of priority from Japanese Patent Application No. 2022-045606, filed on Mar. 22, 2022, the entire contents of which are incorporated herein by reference.

FIELD

Embodiments relate to a semiconductor device.

BACKGROUND

Many transistors made of a nitride semiconductor material have a so-called HEMT (High Electron Mobility Transistor) structure that are of the depletion type. Therefore, a power control semiconductor device comprising the nitride semiconductor transistor preferably has a circuit configuration in which the depletion type transistor and an enhancement type transistor are connected in series.

DETAILED DESCRIPTION

Figure 1:
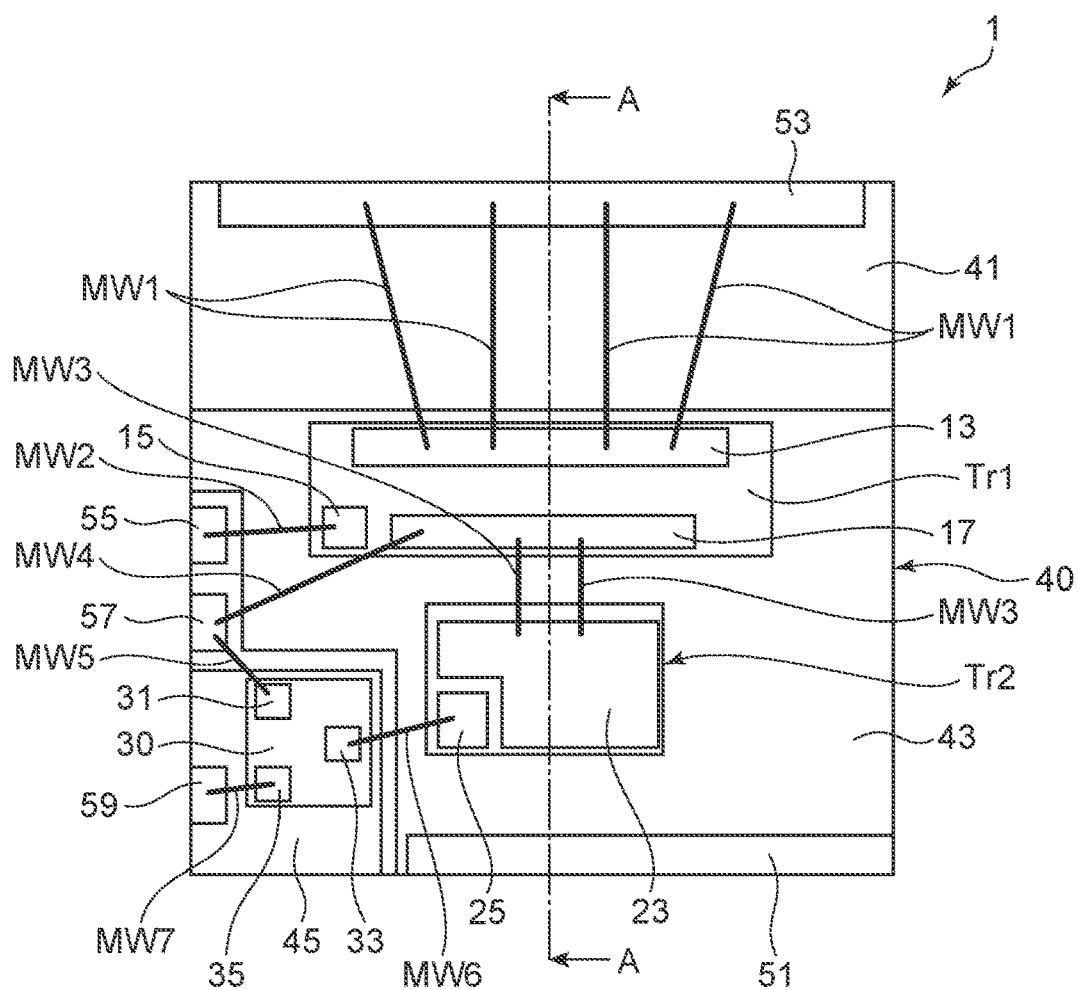
FIG. 1 is a schematic plan view showing a semiconductor device according to a first embodiment.

According to one embodiment, a semiconductor device includes a substrate, a first transistor of a depletion type, a second transistor of an enhancement type, a gate control circuit and a sealing member. The first and second transistors are provided on the substrate and each include a channel region of a first conductivity type. The first and second transistors are connected in series. The channel region of the first transistor includes a nitride semiconductor. The second transistor operates via an inversion layer of a second conductivity type induced in the channel region thereof. The second conductivity type is an opposite polarity of the first conductivity type. The gate control circuit is connected to a gate electrode of the second transistor. The sealing member seals the first transistor, the second transistor, and the gate control circuit on the substrate. The substrate includes a gate terminal and a power supply terminal. The gate terminal is electrically connected to a gate electrode of the first transistor. The power supply terminal is electrically connected to a connection part between the first transistor and the second transistor. The power supply terminal supplies a power supply voltage to the gate control circuit.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic plan view showing a semiconductor device 1 according to a first embodiment. The semiconductor device 1 includes a transistor made of a nitride semiconductor material, e.g., gallium nitride (GaN).

As shown in FIG. 1, the semiconductor device 1 includes a first transistor Tr1 of the depletion type, a second transistor Tr2 of the enhancement type, a gate control element 30, and a substrate 40.

The first transistor Tr1 includes a drain electrode 13, a gate electrode 15, and a source electrode 17. The first transistor Tr1 is, for example, a field-effect transistor (FET) and includes a channel region that includes a nitride semiconductor of a first conductivity type. In the following description, the first conductivity type is an n-type, and a second conductivity type is a p-type.

Figure 2:
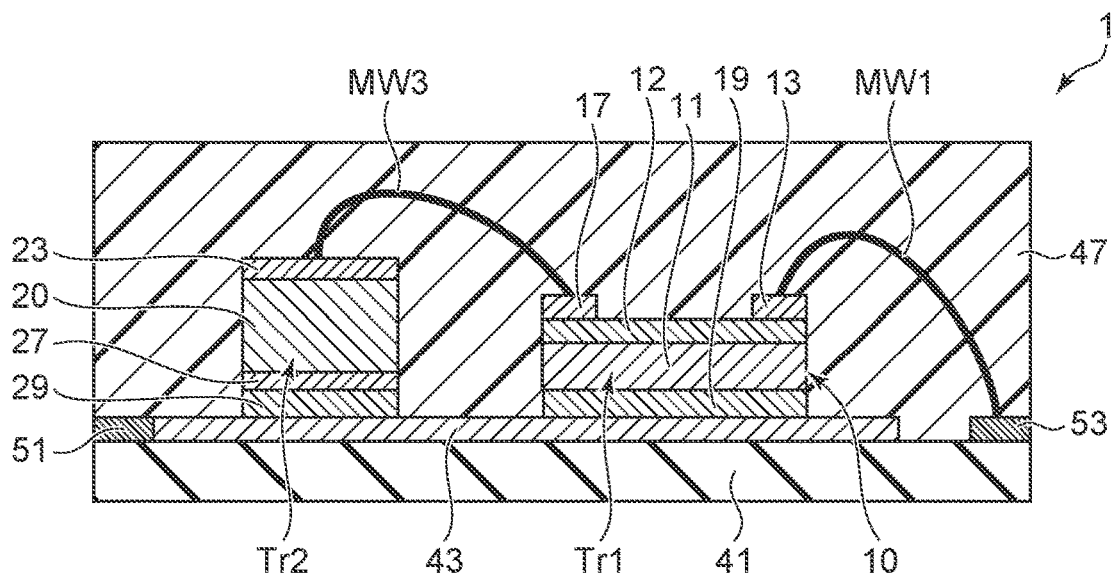
FIG. 2 is a schematic cross-sectional view showing the semiconductor device according to the first embodiment.

The second transistor Tr2 includes a source electrode 23, a gate electrode 25, and a drain electrode 27 (see FIG. 2). The second transistor Tr2 has, for example, a MOS gate structure and operates via an inversion channel of the second conductivity type, i.e., the opposite polarity of the first conductivity type. The second transistor Tr2 is, for example, a PMOS transistor.

The gate control element 30 includes a gate control circuit and is electrically connected to the gate electrode 25 of the second transistor. The gate control element 30 is, for example, a silicon integrated circuit. The gate control element 30 includes an input terminal 31, an output terminal 33, and an earth terminal 35. The embodiment is not limited to the example and may have a configuration in which the second transistor Tr2 and the gate control circuit are integrated without the gate control element 30.

The substrate 40 includes an insulating base 41 (see FIG. 2), a mounting bed 43, and a mounting bed 45. The mounting bed 43 and the mounting bed 45 are provided on the insulating base 41. The mounting bed 43 and the mounting bed 45 are apart from each other. The first transistor Tr1 and the second transistor Tr2 are mounted on the mounting bed 43. The gate control element 30 is mounted on the mounting bed 45.

The substrate 40 further includes a source terminal 51, a drain terminal 53, a gate terminal 55, a power supply terminal 57, and an earth terminal 59. The terminals are apart from each other on the insulating base 41.

The source terminal 51 is linked to, for example, the mounting bed 43 and electrically connected to the mounting bed 43. The drain terminal 53 is, provided at a position apart from the mounting beds 43 and 45 and is electrically insulated from the mounting beds 43 and 45. The gate terminal 55 and the power supply terminal 57 are provided at positions apart from the mounting beds 43 and 45 and are electrically insulated from the mounting beds 43 and 45. The earth terminal 59 is provided on, for example, the mounting bed 45 and electrically connected to the mounting bed 45.

The drain electrode 13 of the first transistor Tr1 is electrically connected to the drain terminal 53 via a metal wire MW1. The gate electrode 15 of the first transistor Tr1 is electrically connected to the gate terminal 55 via a metal wire MW2.

The source electrode 17 of the first transistor Tr1 is electrically connected to the source electrode 23 of the second transistor Tr2 via a metal wire MW3. The source electrode 17 of the first transistor Tr1 are electrically connected to the power supply terminal 57 via a metal wire MW4. In other words, the first transistor Tr1 and the second transistor Tr2 are connected in series, and the power supply terminal 57 is electrically connected to a connection part between the first transistor Tr1 and the second transistor Tr2.

The input terminal 31 of the gate control element 30 is electrically connected to the power supply terminal 57 via a metal wire MW5. The output terminal 33 is electrically connected to the gate electrode 25 of the second transistor Tr2 via a metal wire MW6. The earth terminal 35 is electrically connected to, for example, the earth terminal 59 of the substrate 40 via a metal wire MW7.

FIG. 2 is a schematic cross-sectional view showing the semiconductor device 1 according to the first embodiment. FIG. 2 is a schematic view showing a cross section along A-A line shown in FIG. 1.

As shown in FIG. 2, the first transistor Tr1 and the second transistor Tr2 are provided on the insulating base 41 with the mounting bed 43 interposed. The insulating base 41 includes, for example, a ceramic or a resin. The mounting bed 43 is, for example, a metal film that includes copper (Cu), etc.

The first transistor Tr1 is mounted on the mounting bed 43 with a connection member 19 interposed. The connection member 19 is, for example, a solder material. The first transistor Tr1 includes a semiconductor part 10. The drain electrode 13, the gate electrode 15 (see FIG. 1), and the source electrode 17 are provided on the front surface of the semiconductor part 10.

The semiconductor part 10 of the first transistor Tr1 includes, for example, a semiconductor substrate 11 and an epitaxial layer 12 of the first conductivity type. The semiconductor substrate 11 is, for example, a low-resistance silicon substrate. The epitaxial layer 12 is provided on the semiconductor substrate 11 and includes a nitride semiconductor of the first conductivity type, e.g., a gallium nitride (GaN) layer and an aluminum gallium nitride (AlGaN) layer.

The epitaxial layer 12 has a stacked structure that includes, for example, a non-doped GaN layer provided on the semiconductor substrate 11, a GaN-channel layer on the non-doped GaN layer, and an AlGaN layer on the GaN-channel layer. For example, a two-dimensional electron gas is induced at the interface between the GaN-channel layer and the AlGaN layer. In other words, the epitaxial layer 12 includes a channel region of the FET that includes the GaN-channel layer and the AlGaN layer. The channel region of the epitaxial layer 12 is electrically insulated from the low-resistance semiconductor substrate 11 and the mounting bed 43 by the non-doped GaN layer.

The second transistor Tr2 is mounted on the mounting bed 43 via a connection member 29. The connection member 29 is, for example, a solder material. The second transistor Tr2 includes a semiconductor part 20. The source electrode 23 and the gate electrode 25 (see FIG. 1) are provided on the front surface of the semiconductor part 20. The drain electrode 27 of the second transistor Tr2 is provided on the back surface of the semiconductor part 20. The drain electrode 27 is positioned between the semiconductor part 20 and the connection member 29.

The first transistor Tr1, the second transistor Tr2, and the gate control element 30 (see FIG. 1) are sealed with, for example, a resin member 47 on the substrate 40. For example, the resin member 47 is molded to expose portions of the source terminal 51, the drain terminal 53, the gate terminal 55, the power supply terminal 57, and the earth terminal 59. The embodiment is not limited to the example; for example, a hermetically sealed form may be used instead of resin sealing.

Figure 3:
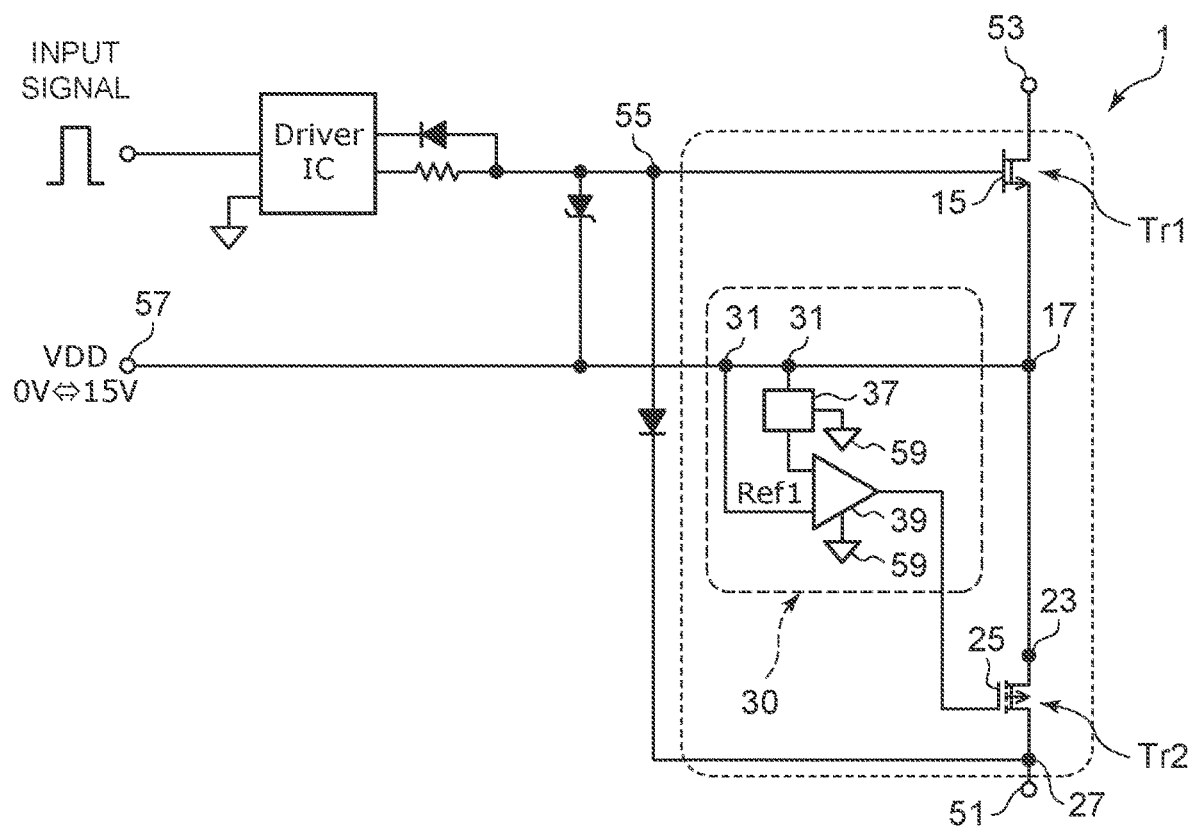
FIG. 3 is a circuit diagram showing the semiconductor device according to the first embodiment.

FIG. 3 is a circuit diagram showing the semiconductor device 1 according to the first embodiment. FIG. 3 also shows external circuits such as a gate driver.

As shown in FIG. 3, an input signal that drives the first transistor Tr1 is supplied to the gate terminal 55 via a driver IC. The input signal is supplied to the gate electrode 15 of the first transistor Tr1 via the gate terminal 55.

A power supply voltage VDD is supplied to the power supply terminal 57. The power supply voltage VDD is supplied to the source electrode 17 of the first transistor Tr1 and the source electrode 23 of the second transistor Tr2 via the power supply terminal 57. The power supply voltage VDD also is supplied to the input terminal 31 of the gate control element 30.

The gate control element 30 includes a first circuit 37 and a second circuit 39. The gate control circuit includes the first circuit 37 and the second circuit 39. The first circuit 37 is configured to output a reference voltage Ref1 with respect to the ground potential. The reference voltage Ref1 is greater than the absolute value of a threshold voltage Vth1 (see FIG. 4) of the first transistor Tr1. The second circuit 39 compares the power supply voltage VDD and the reference voltage Ref1 and outputs 0 V (the ground potential) when the power supply voltage VDD is greater than the reference voltage Ref1. The second circuit 39 outputs the power supply voltage VDD when the power supply voltage VDD is less than the reference voltage Ref1.

Figure 4:
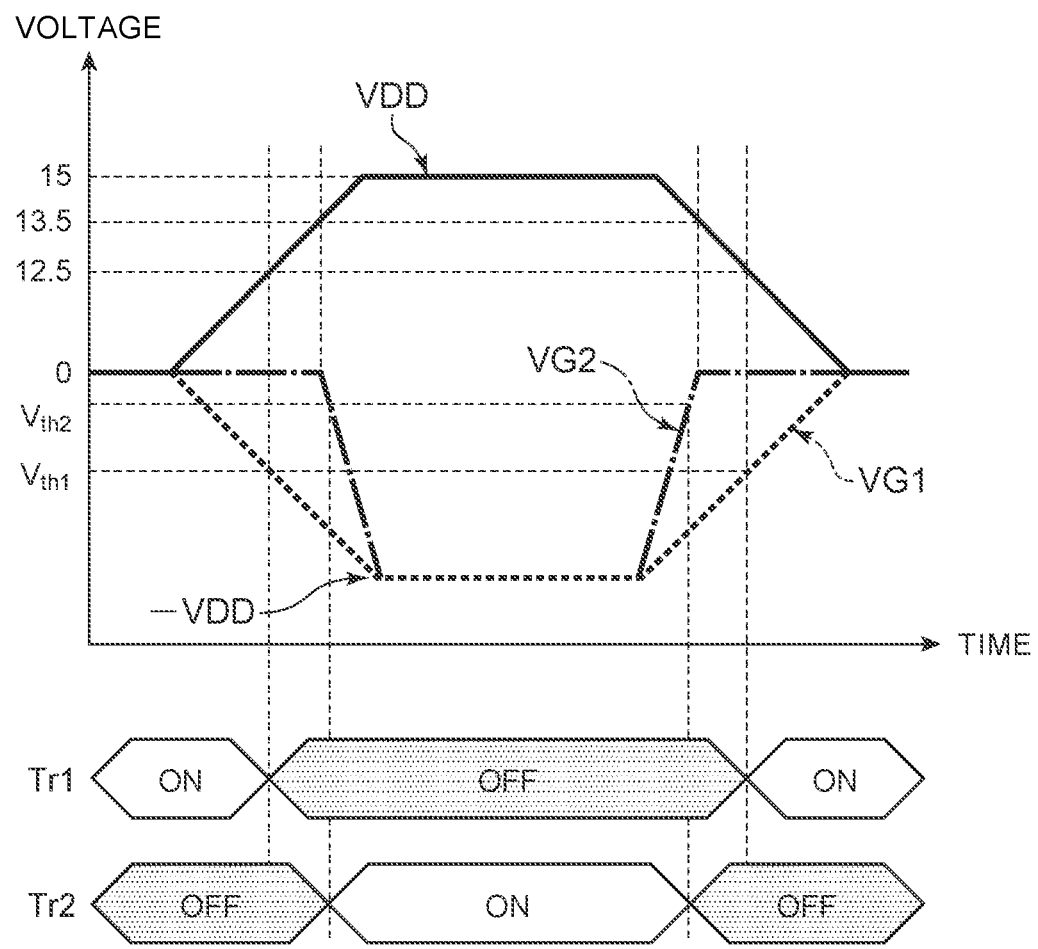
FIG. 4 is a schematic view showing an operation of the semiconductor device according to the first embodiment.

FIG. 4 is a schematic view showing an operation of the semiconductor device 1 according to the first embodiment. FIG. 4 is a time chart showing the temporal change of the power supply voltage VDD, a gate voltage VG1 of the first transistor Tr1, and a gate voltage VG2 of the second transistor Tr2. In the example, no input signal is applied to the gate terminal 55.

As shown in FIG. 4, the power supply voltage VDD rises from 0 V to 15 V and drops from 15 V to 0 V over time. FIG. 4 illustrates the power-on and power-off processes of the power conversion device comprising the semiconductor device 1.

The gate voltage VG1 of the first transistor Tr1 drops with the rise of the power supply voltage VDD; and the first transistor Tr1 changes from the on-state to the off-state when the gate voltage VG1 drops below the threshold voltage Vth1. The gate voltage VG1 rises with the drop of the power supply voltage VDD; and the first transistor Tr1 changes from the off-state to the on-state when the gate voltage VG1 rises above the threshold voltage Vth1. In the example, the threshold voltage Vth1 is 12.5 V, and the power supply voltage VDD is 15 V.

On the other hand, the output of the second circuit 39 (see FIG. 3) is supplied to the gate electrode 25 of the second transistor Tr2. When the power supply voltage VDD is less than the reference voltage Ref1, the power supply voltage VDD is supplied from the second circuit 39 to the gate electrode 25; and the gate voltage VG2 is 0 V. The reference potential Ref1 is, for example, 13.5 V. The gate voltage VG2 is the difference between the power supply voltage VDD and the output of the second circuit 39. The output of the second circuit 39 becomes 0 V when the power supply voltage VDD exceeds the reference voltage Ref1. Therefore, the gate voltage VG2 drops to −VDD.

As shown in FIG. 4, the gate voltage VG2 starts to drop from 0 V when the power supply voltage VDD exceeds the reference voltage Ref1 and drops to −VDD. The second transistor Tr2 changes from the off-state to the on-state when the gate voltage VG2 drops below a threshold voltage Vth2 of the second transistor Tr2. The second transistor Tr2 changes from the on-state to the off-state when the power supply voltage VDD drops and the gate voltage VG2 exceeds the threshold voltage Vth2.

Continuing, when the power supply voltage VDD drops below the reference voltage Ref1, the power supply voltage VDD is supplied from the second circuit 39 to the gate electrode 25 of the second transistor Tr2; and the gate voltage Vth2 becomes 0 V. Subsequently, the first transistor Tr1 changes from the off-state to the on-state when the power supply voltage VDD drops below the absolute value of the threshold voltage Vth1 of the first transistor Tr1.

Thus, the gate control element 30 controls the second transistor Tr2 not to be in the on-state when the first transistor Tr1 is in the on-state. By providing the reference voltage Ref1 greater than the absolute value of the threshold voltage of the first transistor Tr1, the timing at which the gate voltage Vth2 is supplied to the gate electrode 25 of the second transistor Tr2 can be delayed. Also, the timing at which the gate voltage Vth2 supplied to the gate electrode 25 of the second transistor Tr2 is 0 V can be earlier than the timing at which the first transistor Tr1 is turned in the on-state. The first transistor Tr1 and the second transistor Tr2 are thereby prevented from being simultaneously in the on-state, and the semiconductor device 1 can safely operate.

The semiconductor device 1 performs the switching operation by the input signal supplied to the gate terminal 55 during the period in which the gate control element 30 controls the first transistor Tr1 to be in the off-state and the second transistor Tr2 to be in the on-state.

In the semiconductor device 1 according to the embodiment, by housing the first transistor Tr1, the second transistor Tr2, and the gate control element 30 inside a package formed of the insulating base 41 and the resin member 47, it is possible to reduce the lengths of the metal wires MW1 to MW9. The parasitic inductance of the metal wires MW1 to MW9 can be reduced thereby. Thus, it is possible to prevent the gate control element 30 from the malfunction due to external noise. In other words, the semiconductor device 1 can be more safely operated.

Second Embodiment

Figure 5:
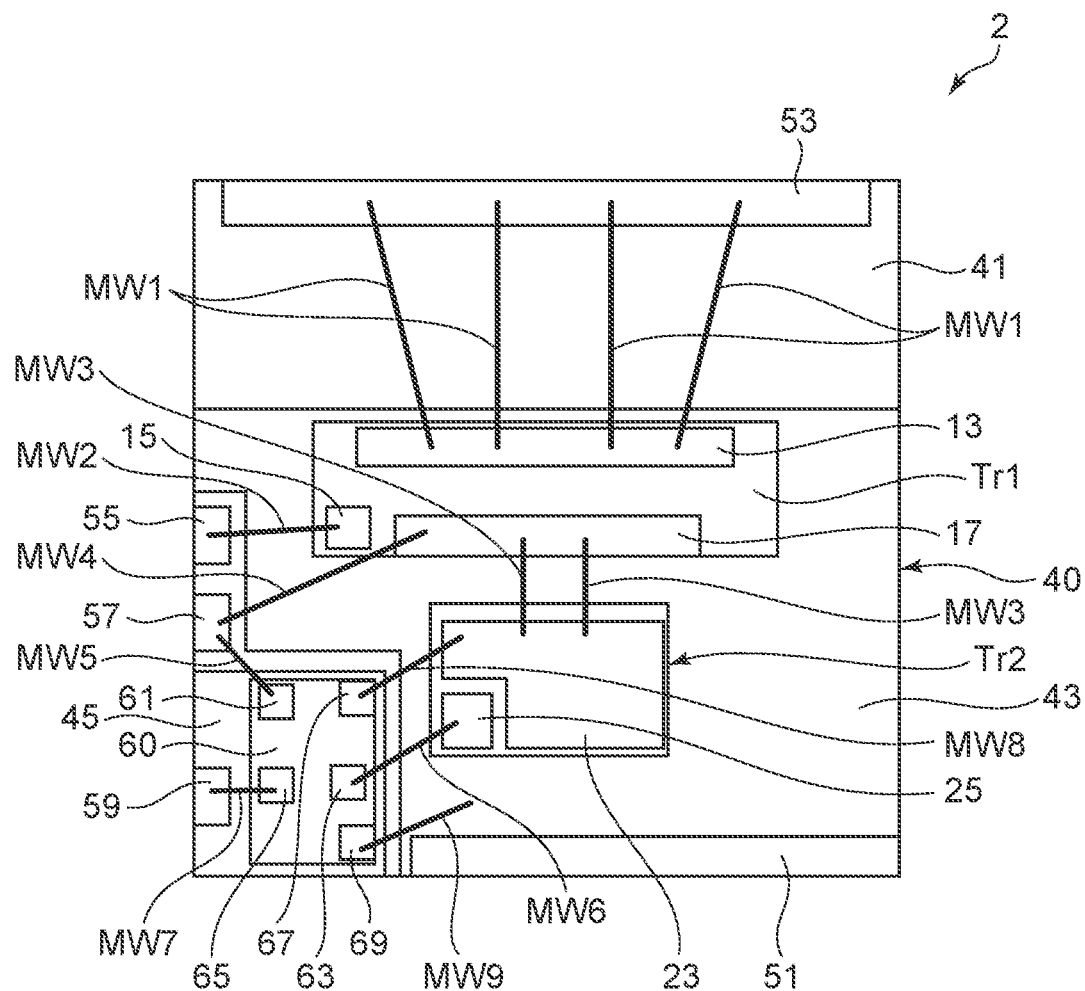
FIG. 5 is a schematic plan view showing a semiconductor device according to a second embodiment.

FIG. 5 is a schematic plan view showing a semiconductor device 2 according to a second embodiment. The semiconductor device 2 includes a gate control element 60 in place of the gate control element 30 of the semiconductor device 1.

The gate control element 60 includes an input terminal 61, an output terminal 63, an earth terminal 65, a first monitor terminal 67, and a second monitor terminal 69.

As shown in FIG. 5, the input terminal 61 is electrically connected to the power supply terminal 57 via the metal wire MW5. The output terminal 63 is electrically connected to the gate electrode 25 of the second transistor Tr2 via the metal wire MW6. The earth terminal 65 is electrically connected to the earth terminal 59 of the substrate 40 via the metal wire MW7.

The first monitor terminal 67 is electrically connected to the source electrode 23 of the second transistor Tr2 via a metal wire MW8. The second monitor terminal 69 is electrically connected to the mounting bed 43 via a metal wire MW9. The gate control element 60 supplies a gate voltage from the output terminal 63 to the gate electrode 25 of the second transistor Tr2. The gate control element 60 is configured to monitor the drain-source voltage of the second transistor Tr2 by using the first monitor terminal 67 and the second monitor terminal 69.

Figure 6:
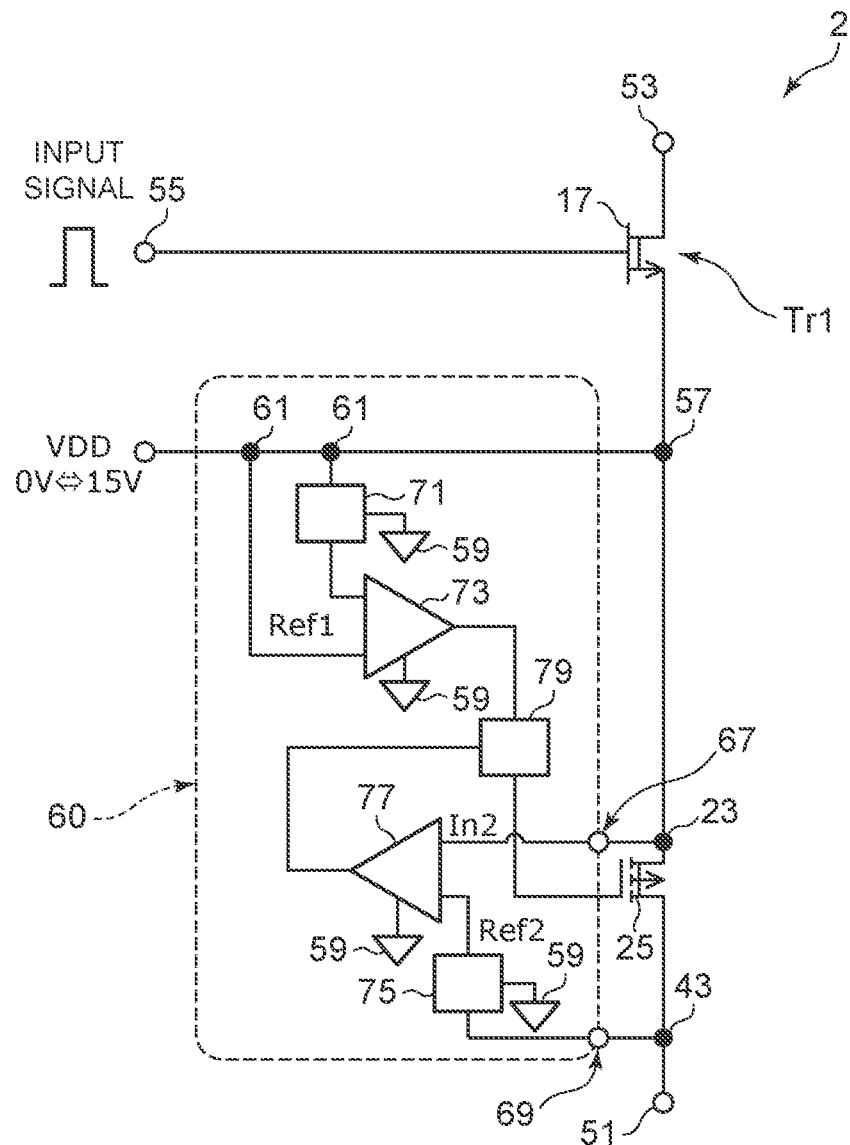
FIG. 6 is a circuit diagram showing the semiconductor device according to the second embodiment.

FIG. 6 is a circuit diagram showing the semiconductor device 2 according to the second embodiment. Also, in the semiconductor device 2, the first transistor Tr1 and the second transistor Tr2 are connected in series, and the power supply voltage VDD is supplied to the connection part between the first transistor Tr1 and the second transistor Tr2. An input signal is supplied from the outside to the gate electrode 15 of the first transistor Tr1.

The gate control element 60 includes a first circuit 71, a second circuit 73, a third circuit 75, a fourth circuit 77, and a fifth circuit 79.

The first circuit 71 is configured to output the reference voltage Ref1 with respect to the ground potential. The reference voltage Refit is greater than the absolute value of the gate threshold voltage Vth1 of the first transistor Tr1.

The second circuit 73 compares the reference voltage Ref1 and the power supply voltage VDD and outputs a voltage corresponding to the comparison result. The second circuit 73 outputs, for example, a "Low" potential when the power supply voltage VDD is less than the reference voltage Ref1; and the second circuit 73 outputs a "High" potential when the power supply voltage VDD is greater than the reference voltage Ref1.

The third circuit 75 is electrically connected to the mounting bed 43 via the second monitor terminal 69. The third circuit 75 outputs a prescribed reference voltage Ref2 that corresponds to the potential of the mounting bed 43. The reference voltage Ref2 corresponds to, for example, the overcurrent flowing in the second transistor Tr2.

The fourth circuit 77 is electrically connected to the source electrode 23 of the second transistor Tr2 via the first monitor terminal 67 (see FIG. 5). The fourth circuit 77 compares the reference voltage Ref2 and the voltage of the source electrode 23 of the second transistor Tr2 and outputs the comparison result. The fourth circuit 77 outputs, for example, "High" when the voltage of the source electrode 23 exceeds the reference voltage Ref2. The fourth circuit 77 outputs "Low" when the voltage of the source electrode 23 drops below the reference voltage Ref2.

The fifth circuit 79 receives the outputs of the second and fourth circuits 73 and 77. The outputs corresponding thereto is supplied from the fifth circuit 79 to the gate electrode 25 of the second transistor Tr2 via the output terminal 63.

When the output of the second circuit 73 is "High" and the output of the third circuit 75 is "High", the fifth circuit 79 outputs VDD and turns off the second transistor Tr2.

When the output of the second circuit 73 is "High" and the output of the third circuit 75 is "Low", the output of the fifth circuit 79 is 0 V. Thus, the second transistor Tr2 is turned on.

When the output of the second circuit 73 is "Low" and the output of the third circuit 75 is "High", the fifth circuit 79 outputs VDD and turns off the second transistor Tr2.

When the output of the second circuit 73 is "Low" and the output of the third circuit 75 is "Low", the fifth circuit 79 outputs VDD and turns off the second transistor Tr2.

As described above, it is possible in the semiconductor device 2 to block overcurrent by the control manner using the gate control element 60. The semiconductor device 2 can be more safely operated thereby.

While certain embodiments have been described, these embodiments have been presented by way of example only and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a substrate;
   a first transistor of a depletion type, the first transistor being provided on the substrate and including a channel region of a first conductivity type, the channel region of the first transistor including a nitride semiconductor;
   a second transistor of an enhancement type, the second transistor being provided on the substrate, the first and second transistors being connected in series, the second transistor including another channel region of the first conductivity type and operating via an inversion layer of a second conductivity type induced in said another channel region, the second conductivity type being an opposite polarity of the first conductivity type;
   a gate control circuit connected to a gate electrode of the second transistor; and
   a sealing member sealing the first transistor, the second transistor, and the gate control circuit on the substrate, the substrate including a gate terminal and a power supply terminal, the gate terminal being electrically connected to a gate electrode of the first transistor, the power supply terminal being electrically connected to a connection part between the first transistor and the second transistor, the power supply terminal supplying a power supply voltage to the gate control circuit.

2. The semiconductor device according to claim 1, wherein
   the gate control circuit detects a source-drain voltage of the second transistor and turns off the second transistor when the source-drain voltage exceeds a prescribed value.

3. The semiconductor device according to claim 1, wherein
   the gate control circuit turns off the second transistor when the power supply voltage is not more than an absolute value of a threshold voltage of the first transistor.

4. The semiconductor device according to claim 3, wherein
   the gate control circuit turns on the second transistor when the power supply voltage is greater than the absolute value of the threshold voltage of the first transistor.

5. The semiconductor device according to claim 4, wherein
   the gate control circuit turns on the second transistor after the power supply voltage exceeds the absolute value of the threshold voltage of the first transistor while the power supply voltage rises from 0 V to a prescribed voltage, and
   the gate control circuit turns off the second transistor before the power supply voltage drops below the absolute value of the threshold voltage of the first transistor while the power supply voltage drops from the prescribed voltage to 0 V.

6. The semiconductor device according to claim 5, wherein
   the control circuit is configured to control first and second intervals of time,
   the first interval being between first and second points of time, the power supply voltage exceeding the absolute value of the threshold voltage of the first transistor at the first point of time, the second transistor being turned on at the second point of time,
   the second interval being between third and fourth points of time, the second transistor being turned off at the third point of time, the power supply voltage dropping below the absolute value of the threshold voltage of the first transistor at the fourth point of time.

7. The semiconductor device according to claim 1, wherein
   the gate control circuit controls a gate of the second transistor so that the first transistor and the second transistor are not in an on-state simultaneously during raising and dropping periods of the power supply voltage.

8. The semiconductor device according to claim 1, wherein the gate control circuit is included in a control chip mounted on the substrate.

9. The semiconductor device according to claim 8, wherein
   the substrate further includes an insulating base and first and second mounting beds, the first and second mounting beds being provided on the insulating base, the first and second mounting beds being arranged along a front surface of the insulating base, the first mounting bed being apart from the second mounting bed;
   the first transistor and the second transistor are mounted on the first mounting bed; and
   the control chip is mounted on the second mounting bed.

10. The semiconductor device according to claim 9, wherein
    the gate terminal and the power supply terminal are provided on the insulating base, and
    the first mounting bed, the second mounting bed, the gate terminal, and the power supply terminal are apart from each other.

11. The semiconductor device according to claim 1, wherein
    the first transistor includes a semiconductor substrate and a nitride semiconductor layer, the nitride semiconductor layer being provided on the semiconductor substrate.

12. The semiconductor device according to claim 11, wherein
    the nitride semiconductor layer is electrically insulated from the semiconductor substrate, and
    the first transistor is mounted on the substrate so that the semiconductor substrate faces the substrate via a first connection member.

13. The semiconductor device according to claim 1, wherein
    the second transistor includes a semiconductor part, a drain electrode, a source electrode and a gate electrode, the semiconductor part including silicon, the drain electrode being provided on a back surface of the semiconductor part, the source electrode being provided on a front surface of the semiconductor part, the front surface being at a side opposite to the back surface, the source electrode and the gate electrode being arranged along the front surface of the semiconductor part, and the second transistor is mounted on the substrate so that the drain electrode faces the substrate via a second connection member.

14. The semiconductor device according to claim 1, wherein the sealing member includes a resin molded on the substrate.

* * * * *